United States Patent
Sasaki

(10) Patent No.: US 11,073,575 B2
(45) Date of Patent: *Jul. 27, 2021

(54) MAGNETORESISTANCE EFFECT ELEMENT, MAGNETIC SENSOR AND MAGNETIC MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 61 days.

This patent is subject to a terminal disclaimer.

(21) Appl. No.: 16/099,756

(22) PCT Filed: Sep. 1, 2017

(86) PCT No.: PCT/JP2017/031567
§ 371 (c)(1),
(2) Date: Nov. 8, 2018

(87) PCT Pub. No.: WO2018/043702
PCT Pub. Date: Mar. 8, 2018

(65) Prior Publication Data
US 2019/0137576 A1    May 9, 2019

(30) Foreign Application Priority Data

Sep. 2, 2016 (JP) .............. JP2016-171995

(51) Int. Cl.
*G01R 33/09* (2006.01)
*H01L 43/08* (2006.01)
(Continued)

(52) U.S. Cl.
CPC ............ *G01R 33/09* (2013.01); *H01F 10/30* (2013.01); *H01L 21/8239* (2013.01);
(Continued)

(58) Field of Classification Search
CPC .. G01R 33/093; G01R 33/096; G01R 33/098; G11C 11/16; H01L 27/222; H01L 43/08; H01L 43/10
(Continued)

(56) References Cited

U.S. PATENT DOCUMENTS

2002/0036315 A1*  3/2002  Adachi ............ H01L 43/10
                                                   360/324.2
2010/0187591 A1*  7/2010  Nagashima ...... H01L 27/2481
                                                   257/314
(Continued)

FOREIGN PATENT DOCUMENTS

JP    5586028 B2    9/2014
JP    5588019 B2    9/2014
JP    2016-105340 A  6/2016

OTHER PUBLICATIONS

H. Sukegawa et al., "Tunnel magnetoresistance with improved bias voltage dependence in lattice-matched Fe/spinel MgAl2O4/Fe(001) junctions", Applied Physics Letters 96, pp. 212505-1 to 212505-3, 2010.
(Continued)

*Primary Examiner* — Melissa J Koval
*Assistant Examiner* — Trung Q Nguyen
(74) *Attorney, Agent, or Firm* — Oliff PLC

(57) ABSTRACT

The present invention provides a magnetoresistance effect element that has a first ferromagnetic metal layer, a second ferromagnetic metal layer, and a tunnel barrier layer provided between the first ferromagnetic metal layer and the second ferromagnetic metal layer. The tunnel barrier layer has a cubic crystal structure, and the first ferromagnetic metal layer or the second ferromagnetic metal layer is formed of a material having a cubic crystal structure represented by $Fe_2CoSi$. A crystal surface for crystals constituting the tunnel barrier layer and a crystal surface for crystals
(Continued)

constituting the first ferromagnetic metal layer or the second ferromagnetic metal layer are matched to be inclined at 0° or 45° in at least a part of a crystal interface between the tunnel barrier layer and the first ferromagnetic metal layer or the second ferromagnetic metal layer.

20 Claims, 5 Drawing Sheets

(51) Int. Cl.
      *H01F 10/30*     (2006.01)
      *H01L 43/10*     (2006.01)
      *H01L 29/82*     (2006.01)
      *H01L 27/22*     (2006.01)
      *H01L 21/8239*     (2006.01)
      *H01L 27/105*     (2006.01)

(52) U.S. Cl.
    CPC ............ *H01L 27/105* (2013.01); *H01L 27/22* (2013.01); *H01L 29/82* (2013.01); *H01L 43/08* (2013.01); *H01L 43/10* (2013.01)

(58) Field of Classification Search
    USPC ........ 324/219–252, 200, 207.2–207.24, 500, 324/526–530, 750.12, 750.21, 754.17, 324/754.29, 443, 600, 610, 648–706, 725, 324/98
    See application file for complete search history.

(56) References Cited

U.S. PATENT DOCUMENTS

| | | |
|---|---|---|
| 2012/0091548 A1 | 4/2012 | Sukegawa et al. |
| 2013/0003579 A1 | 1/2013 | Lu et al. |
| 2014/0284592 A1* | 9/2014 | Nagamine ............. H01F 41/307 257/43 |
| 2016/0154071 A1 | 6/2016 | Sasaki |
| 2017/0170392 A1* | 6/2017 | Sasaki ..................... H01L 43/10 |

OTHER PUBLICATIONS

Y. Miura et al., "First-principles study of tunneling magnetoresistance in Fe/MgAl2O4/Fe(001) magnetic tunnel junctions", Physical Review B 86, pp. 024426-1 to 024426-6, 2012.

T. Scheike et al., "Lattice-matched magnetic tunnel junctions using a Heusler alloy Co2FeAl and a cation-disorder spinel Mg—Al—O barrier", Applied Physics Letters 105, pp. 242407-1 to 242407-5, 2014.

Nov. 14, 2017 International Search Report issued in International Patent Application No. PCT/JP2017/031567.

Mar. 2, 2020 Office Action issued in U.S. Appl. No. 16/662,697.

\* cited by examiner

MAGNETORESISTANCE EFFECT ELEMENT, MAGNETIC SENSOR AND MAGNETIC MEMORY

TECHNICAL FIELD

The present invention relates to a magnetoresistance effect element, a magnetic sensor, and a magnetic memory.

Priority is claimed on Japanese Patent Application No. 2016-171995, filed Sep. 2, 2016, the content of which is incorporated herein by reference.

BACKGROUND ART

A giant magnetoresistance (GMR) element that is formed of a multilayer film of a ferromagnetic layer and a non-magnetic layer and a tunnel magnetoresistance (TMR) element that uses an insulating layer (a tunnel barrier layer or a barrier layer) as a non-magnetic layer are known. The TMR element generally has higher element resistance than the GMR element, but a magnetoresistance (MR) ratio of the TMR element is larger than an MR ratio of the GMR element. For this reason, the TMR element is drawing attention as an element for a magnetic sensor, a high frequency component, a magnetic head, and a magnetic random access memory (MRAM).

A ferromagnetic body composed mainly of at least one of Fe and Co is generally widely used as a ferromagnetic layer of a magnetoresistance effect element (e.g., Patent Document 1). To be specific, Co—Fe, Co—Fe—B, and the like are known.

Studies of using a Heusler alloy expressed as $X_2YZ$ for a ferromagnetic layer have also been performed (e.g., Patent Document 2). $Co_2FeSi$ is known to exhibit the highest Curie temperature in the Co series and to exhibit high polarizability, and has thus attracted attention.

CITATION LIST

Patent Literature

[Patent Document 1]
Japanese Unexamined Patent Application, First Publication No. 2016-105340
[Patent Document 2]
Japanese Patent No. 5586028

SUMMARY OF INVENTION

Technical Problem

It was confirmed that $Fe_2CoSi$ exhibited soft magnetism as a result of searching for ferromagnetic materials. That is, $Fe_2CoSi$ is a material that can be applied to a free layer of a magnetoresistance effect element such as a magnetic sensor, a memory sensor, an MRAM, or the like, and future development is expected. Meanwhile, $Fe_2CoSi$ is a material that has not been sufficiently studied. For this reason, problems that occur when $Fe_2CoSi$ is used for a magnetoresistance effect element have not been sufficiently reported on.

When studies of using $Fe_2CoSi$ for a free layer were performed under this background, a sufficient MR ratio was not always obtained.

The present invention was made in view of the above circumstances, and an object thereof is to provide a magnetoresistance effect element that contains $Fe_2CoSi$ that is a soft magnetic material and has a high MR ratio.

Solution to Problem

As a result of intensive studies, the inventors found that a magnetoresistance effect element having a high MR ratio is obtained by setting a matching state of a lattice when a tunnel barrier layer and a ferromagnetic layer are laminated.

That is, the present invention provides the following means to solve the above problem.

(1) A magnetoresistance effect element according to a first aspect of the present invention includes: a first ferromagnetic metal layer; a second ferromagnetic metal layer; and a tunnel barrier layer provided between the first ferromagnetic metal layer and the second ferromagnetic metal layer. The tunnel barrier layer has a cubic crystal structure, and the first ferromagnetic metal layer or the second ferromagnetic metal layer is formed of a material having a cubic crystal structure represented by $Fe_2CoSi$. A crystal surface for crystals constituting the tunnel barrier layer and a crystal surface for crystals constituting the first ferromagnetic metal layer or the second ferromagnetic metal layer are matched to be inclined at 0° or 45° in at least a part of a crystal interface between the tunnel barrier layer and the first ferromagnetic metal layer or the second ferromagnetic metal layer.

A magnetoresistance effect element according to a second aspect of the present invention includes: a first ferromagnetic metal layer; a second ferromagnetic metal layer; and a tunnel barrier layer provided between the first ferromagnetic metal layer and the second ferromagnetic metal layer. The tunnel barrier layer has a cubic crystal structure, and the first ferromagnetic metal layer or the second ferromagnetic metal layer is formed of a material having a cubic crystal structure represented by $Fe_2CoSi$. A crystal surface for crystals constituting the tunnel barrier layer and a crystal surface for crystals constituting the ferromagnetic layer formed of $Fe_2CoSi$ are matched to be inclined at 0° or 45° in at least a part of a crystal interface between the tunnel barrier layer and the ferromagnetic layer that is formed of $Fe_2CoSi$ and is selected from the first ferromagnetic metal layer and the second ferromagnetic metal layer, and a degree of lattice matching between the tunnel barrier layer and the ferromagnetic layer formed of $Fe_2CoSi$ is 10% or less.

(2) In the magnetoresistance effect element according to the aspects, the tunnel barrier layer may be formed of any one of the group consisting of $MgO$, $MgAl_2O_4$, $\gamma$-$Al_2O_3$, $ZnAl_2O_4$, and a mixed crystal material thereof, and the crystal surface for the crystals constituting the tunnel barrier layer and the crystal surface for the crystals constituting the first ferromagnetic metal layer or the second ferromagnetic metal layer may be matched to be inclined at 45° in the crystal interface.

(3) In the magnetoresistance effect element according to the aspects, the tunnel barrier layer may be formed of $MgO$.

(4) In the magnetoresistance effect element according to the aspects, the tunnel barrier layer may be formed of $MgAl_2O_4$.

(5) In the magnetoresistance effect element according to the aspects, the tunnel barrier layer may be formed of $\gamma$-$Al_2O_3$.

(6) In the magnetoresistance effect element according to the aspects, the tunnel barrier layer may be formed of $ZnAl_2O_4$.

(7) In the magnetoresistance effect element according to the aspects, the tunnel barrier layer may be formed of any one of the group consisting of $MgGa_2O_4$, $ZnGa_2O_4$, $CdAl_2O_4$, and a mixed crystal material thereof.

(8) In the magnetoresistance effect element according to the aspects, the tunnel barrier layer may be formed of $MgGa_2O_4$, and the crystal surface for the crystals constituting the tunnel barrier layer and the crystal surface for the crystals constituting the first ferromagnetic metal layer or the second ferromagnetic metal layer may be matched to be inclined at 45° in the crystal interface.

(9) In the magnetoresistance effect element according to the aspects, the tunnel barrier layer may be formed of $MgGa_2O_4$, and the crystal surface for the crystals constituting the tunnel barrier layer and the crystal surface for the crystals constituting the first ferromagnetic metal layer or the second ferromagnetic metal layer may be matched to be inclined at 0° in the crystal interface.

(10) In the magnetoresistance effect element according to the aspects, the tunnel barrier layer may be formed of $MgGa_2O_4$, and portions where the crystal surface for the crystals constituting the tunnel barrier layer and the crystal surface for the crystals constituting the first ferromagnetic metal layer or the second ferromagnetic metal layer are matched to be inclined at 0° and 45° in the crystal interface may be mixed.

(11) In the magnetoresistance effect element according to the aspects, the tunnel barrier layer may be formed of $ZnGa_2O_4$, and the crystal surface for the crystals constituting the tunnel barrier layer and the crystal surface for the crystals constituting the first ferromagnetic metal layer or the second ferromagnetic metal layer may be matched to be inclined at 45° in the crystal interface.

(12) In the magnetoresistance effect element according to the aspects, the tunnel barrier layer may be formed of $ZnGa_2O_4$, and the crystal surface for the crystals constituting the tunnel barrier layer and the crystal surface for the crystals constituting the first ferromagnetic metal layer or the second ferromagnetic metal layer may be matched to be inclined at 0° in the crystal interface.

(13) In the magnetoresistance effect element according to the aspects, the tunnel barrier layer may be formed of $ZnGa_2O_4$, and portions where the crystal surface for the crystals constituting the tunnel barrier layer and the crystal surface for the crystals constituting the first ferromagnetic metal layer or the second ferromagnetic metal layer are matched to be inclined at 0° and 45° in the crystal interface may be mixed.

(14) In the magnetoresistance effect element according to the aspects, the tunnel barrier layer may be formed of $CdAl_2O_4$, and the crystal surface for the crystals constituting the tunnel barrier layer and the crystal surface for the crystals constituting the first ferromagnetic metal layer or the second ferromagnetic metal layer may be matched to be inclined at 45° in the crystal interface.

(15) In the magnetoresistance effect element according to the aspects, the tunnel barrier layer may be formed of $CdAl_2O_4$, and the crystal surface for the crystals constituting the tunnel barrier layer and the crystal surface for the crystals constituting the first ferromagnetic metal layer or the second ferromagnetic metal layer may be matched to be inclined at 0° in the crystal interface.

(16) In the magnetoresistance effect element according to the aspects, the tunnel barrier layer may be formed of $CdAl_2O_4$, and portions where the crystal surface for the crystals constituting the tunnel barrier layer and the crystal surface for the crystals constituting the first ferromagnetic metal layer or the second ferromagnetic metal layer are matched to be inclined at 0° and 45° in the crystal interface may be mixed.

(17) In the magnetoresistance effect element according to the aspects, the tunnel barrier layer may be formed of $CdGa_2O_4$, and the crystal surface for the crystals constituting the tunnel barrier layer and the crystal surface for the crystals constituting the first ferromagnetic metal layer or the second ferromagnetic metal layer may be matched to be inclined at 0° in the crystal interface.

(18) In the magnetoresistance effect element according to the aspects, at least one of the first ferromagnetic metal layer and the second ferromagnetic metal layer may have magnetic anisotropy perpendicular to the crystal interface.

(19) A magnetic sensor according to an aspect of the present invention uses the magnetoresistance effect element according to the aspects.

(20) A magnetic memory according to an aspect of the present invention uses the magnetoresistance effect element according to the aspects.

Advantageous Effects of Invention

According to the present invention, a magnetoresistance effect element that contains $Fe_2CoSi$ that is a soft magnetic material and has a high MR ratio can be obtained.

DESCRIPTION OF EMBODIMENTS

Hereinafter, an embodiment of the present invention will be described in detail with reference to the attached drawings. In the description of the drawings, the same elements will be given the same reference signs, and a duplicate description thereof will be omitted.

[Magnetoresistance Effect Element]

Figure 1:
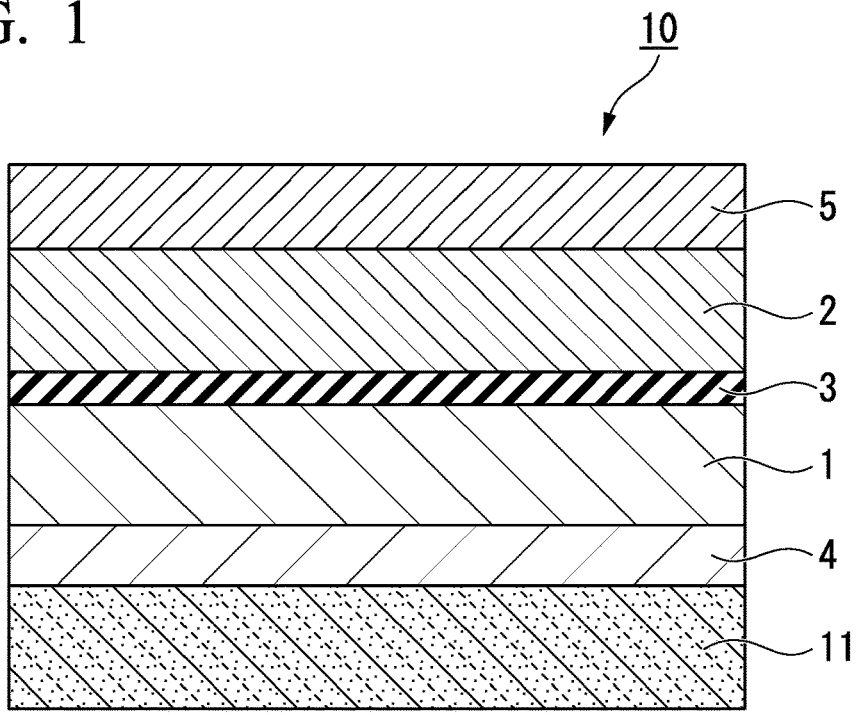
FIG. 1 is a schematic sectional view of a magnetoresistance effect element according to an embodiment of the present invention.

FIG. 1 is a schematic sectional view of a magnetoresistance effect element according to the present embodiment. A magnetoresistance effect element 10 shown in FIG. 1 is provided on a substrate 11. The magnetoresistance effect element 10 shown in FIG. 1 is laminated from the substrate 11 in the order of an underlayer 4, a first ferromagnetic metal layer 1, a tunnel barrier layer 3, a second ferromagnetic metal layer 2, and a cap layer 5. The underlayer 4 and the cap layer 5 are not essential layers, and may be removed.

(First and Second Ferromagnetic Metal Layers)

The first ferromagnetic metal layer 1 has greater coercivity than the second ferromagnetic metal layer 2. That is, magnetization of the first ferromagnetic metal layer 1 is fixed in one direction, and a magnetization direction of the second ferromagnetic metal layer 2 is relatively changed. Thereby, these layers function as the magnetoresistance effect element 10. The first ferromagnetic metal layer 1 is called a fixed layer or a reference layer, and the second ferromagnetic metal layer 2 is called a free layer or a recording layer.

A known material (a ferromagnetic metal) can be used for the first ferromagnetic metal layer 1. For example, a metal selected from the group consisting of Cr, Mn, Co, Fe, and Ni and an alloy that contains one or more of these metals and exhibits ferromagnetism can be used. In addition, an alloy that contains these metals and at least one or more of the elements B, C, and N can be used. Co—Fe and Co—Fe—B are specific examples.

A Heusler alloy such as $Co_2FeSi$ is preferably used to obtain higher output. The Heusler alloy contains an intermetallic compound having a chemical composition of $X_2YZ$ where X represents a Co-, Fe-, Ni-, or Cu-group transition metal element or a noble metal element on the periodic table, Y represents a Mn-, V-, Cr-, or Ti-group transition metal, or can also represent the element represented by X, and Z represents a representative element from group III to group V. $Co_2FeSi$, $Co_2MnSi$, $Co_2Mn_{1-a}Fe_aAl_bSi_{1-b}$, and the like are examples.

To make coercivity of the first ferromagnetic metal layer 1 greater than that of the second ferromagnetic metal layer 2, an antiferromagnetic material such as IrMn, PtMn, or the like may be used as a material that is in contact with the first ferromagnetic metal layer 1. Furthermore, to prevent a leakage magnetic field of the first ferromagnetic metal layer 1 from affecting the second ferromagnetic metal layer 2, a synthetic antiferromagnetic coupling structure may be used.

Furthermore, when a magnetization direction of the first ferromagnetic metal layer 1 is made perpendicular to a lamination surface, laminated films of Co and Pt are preferably used. To be specific, the first ferromagnetic metal layer 1 can be set to [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm). A thickness of the first ferromagnetic metal layer 1 is not particularly limited, but it is preferably set to 1 nm or more, and more preferably 1 nm or more and 20 nm or less.

$Fe_2CoSi$ is used as a material of the second ferromagnetic metal layer 2. $Fe_2CoSi$ is a soft magnetic material. For this reason, spins of the second ferromagnetic metal layer 2 are subjected to easier magnetization reversal than those of the first ferromagnetic metal layer 1, and the second ferromagnetic metal layer 2 is optimal as the free layer. $Fe_2CoSi$ has a cubic crystal structure. $Fe_2CoSi$ is not necessarily limited to this composition ratio. Since Fe and Co can exchange positions of elements with each other, Fe can be made larger than 2. Similarly, Co can be made larger than 1. A function as the soft magnetic material occurs when Fe is at least more than Co.

When the magnetization direction of the second ferromagnetic metal layer 2 is made perpendicular to the lamination surface, the thickness of the second ferromagnetic metal layer 2 is preferably set to 2.5 nm or less. Thereby, perpendicular magnetic anisotropy can be induced in the second ferromagnetic metal layer 2 at an interface between the second ferromagnetic metal layer 2 and the tunnel barrier layer 3. Since an effect of the perpendicular magnetic anisotropy is attenuated by increasing a film thickness of the second ferromagnetic metal layer 2, the film thickness of the second ferromagnetic metal layer 2 is preferably thin. The lower limit of the film thickness of the second ferromagnetic metal layer 2 is not particularly limited, but is preferably 1 nm.

To utilize the magnetoresistance effect element as the magnetic sensor, resistance preferably changes linearly with respect to an external magnetic field. The magnetization direction is easily directed into the lamination surface on a laminated film of a general ferromagnetic layer by shape anisotropy. In this case, for example, a magnetic field is applied from the outside, and the magnetization directions of the first and second ferromagnetic metal layers are made perpendicular. Thereby, the resistance changes linearly with respect to the external magnetic field. However, in this case, a mechanism for applying a magnetic field near the magnetoresistance effect element is required, and this is not desirable for performing integration. For this reason, the ferromagnetic metal layer itself preferably has the perpendicular magnetic anisotropy.

Here, an example of a so-called bottom pin structure in which the first ferromagnetic metal layer 1 is used as a magnetization fixed layer, and the second ferromagnetic metal layer 2 is used a magnetization free layer is given as a structure of the magnetoresistance effect element 10, but the structure of the magnetoresistance effect element 10 is not particularly limited. As the structure of the magnetoresistance effect element 10, a top pin structure in which the first ferromagnetic metal layer 1 is used as the magnetization free layer and the second ferromagnetic metal layer 2 is used as the magnetization fixed layer may be adopted. In this case, a material of which the first ferromagnetic metal layer 1 is formed is $Fe_2CoSi$.

(Tunnel Barrier Layer)

The tunnel barrier layer 3 is formed of a nonmagnetic insulating material. A film thickness of the tunnel barrier layer 3 is generally a thickness of 3 nm or less. A lower limit of the film thickness of the tunnel barrier layer 3 is not particularly limited, but is preferably 0.6 nm. In the case where the tunnel barrier layer 3 is surrounded by a metal material, a wave function of electrons of atoms of the metal material spreads beyond the tunnel barrier layer 3, and thus a current flows regardless of whether there is an insulator on a circuit. The magnetoresistance effect element 10 has a structure in which the tunnel barrier layer 3 is interposed between the ferromagnetic metal materials (the first ferromagnetic metal layer 1 and the second ferromagnetic metal layer 2), and a resistance value is determined by a relative angle between the magnetization directions of the interposed ferromagnetic metal materials.

Examples of the magnetoresistance effect element 10 include one using a typical tunnel effect and one in which a coherent tunnel effect that an orbit during tunneling is restricted is predominant. In the typical tunnel effect, a magnetoresistance effect is obtained by spin polarizability of the ferromagnetic material. In the coherent tunnel, the orbit during tunneling is restricted. For this reason, in the magnetoresistance effect element in which the coherent tunnel is predominant, an effect greater than or equal to the spin polarizability of the ferromagnetic metal material can be expected. To develop the coherent tunnel effect, the ferromagnetic metal material and the tunnel barrier layer 3 are preferably crystallized and coupled in a specific orientation.

The tunnel barrier layer 3 has a cubic crystal structure. Here, the "cubic crystal structure" also includes a crystal structure in which a cubic crystal is partly distorted. The tunnel barrier layer 3 does not exist as a simple bulk, and is formed as a thin film. The tunnel barrier layer 3 does not exist in a single layer, and exists as a part of a laminate in which a plurality of layers are laminated. For this reason, the tunnel barrier layer 3 can also assume a crystal structure in which a cubic crystal is partly distorted. In general, misalignment from the cubic crystal of the tunnel barrier layer 3 is slight, and depends on the accuracy of a measuring method of evaluating the structure.

The tunnel barrier layer 3 is one selected from the group consisting of MgO, $MgAl_2O_4$, $\gamma$-$Al_2O_3$, $ZnAl_2O_4$, $MgGa_2O_4$, $ZnGa_2O_4$, $CdAl_2O_4$, and $CdGa_2O_4$, or is composed of a mixed crystal thereof. A composition formula represented herein is represented as a theoretical formula, and actually includes a range in which a ratio deviates from this composition formula. For example, the case where an oxygen deficiency occurs and $MgAl_2O_{4-\alpha}$, (where $\alpha$ is a real number) is formed, the case where a ratio between Mg and Al is changed and $Mg_{1-\beta}Al_{2+\beta}O_4$ (where $\beta$ is a real number) is formed, the case where Mg sites are lacking and $Mg_{1-\gamma}Al_2O_4$ (where $\gamma$ is a real number) is formed, and the like are included.

MgO has a rock salt structure, and $MgAl_2O_4$, $\gamma$-$Al_2O_3$, $ZnAl_2O_4$, $MgGa_2O_4$, $ZnGa_2O_4$, $CdAl_2O_4$ and $CdGa_2O_4$ have spinel structures. Either the rock salt structure or the spinel structure is included in the cubic structure. For this reason, any material is a cubic crystal, and can be matched with the ferromagnetic metal layer formed of $Fe_2CoSi$. The spinel structure mentioned herein is a concept that includes both an ordered spinel structure and a Sukenel structure.

Figure 2:
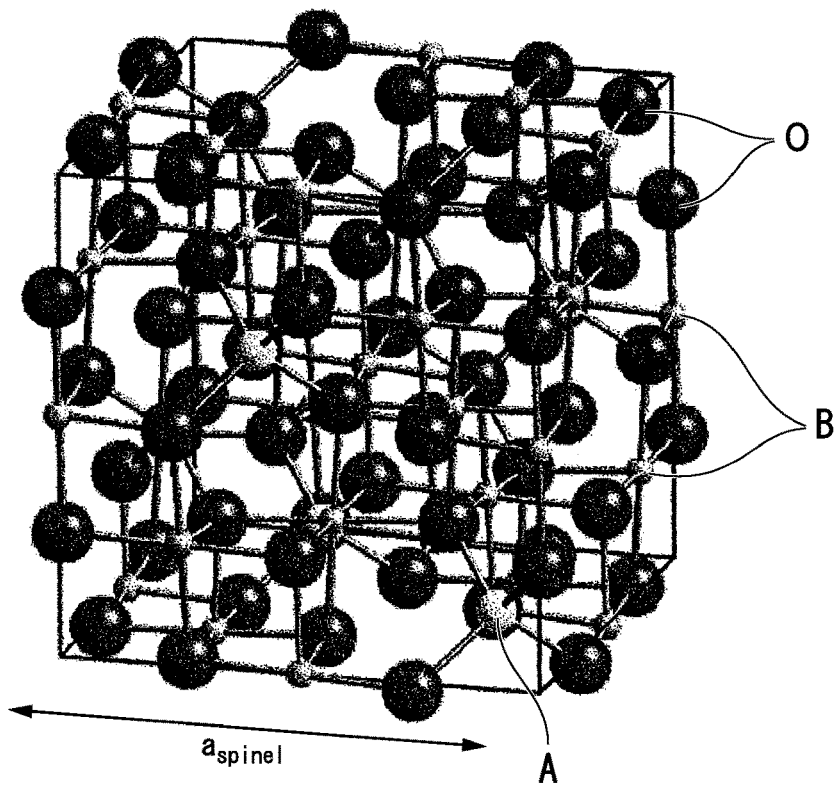
FIG. 2 is a view of a crystal structure of a spinel.

FIG. 2 is a view schematically showing a spinel type crystal structure. The spinel structure is a crystal structure composed of cations and oxygen ions. In the spinel structure, portions where the cations are arranged are an A site in which oxygen is four-coordinated and a B site in which oxygen is six-coordinated. In FIG. 2, a reference sign O indicates an oxygen ion, a reference sign A indicates to an A site, a reference sign B indicates a B site, and a reference sign $a_{spinel}$ indicates a lattice constant of the spinel structure.

The Sukenel structure is a structure in which the cations of the spinel structure are disordered. In the Sukenel structure, arrangement of oxygen ions assumes a closest packed cubic lattice that is nearly equivalent to that of the spinel, but atomic arrangement of cations is disordered. In the ordered spinel structure, the cations are regularly arranged in tetrahedral and octahedral-interstitial sites of the oxygen ions. In contrast, in the Sukenel structure, the cations are randomly arranged, and are situated at tetrahedral and octahedral positions of the oxygen atoms that are not originally occupied. As a result, the Sukenel structure is a structure in which the symmetry of the crystal is changed, and a lattice constant is substantially reduced by half with respect to the ordered spinel structure.

Figure 3:
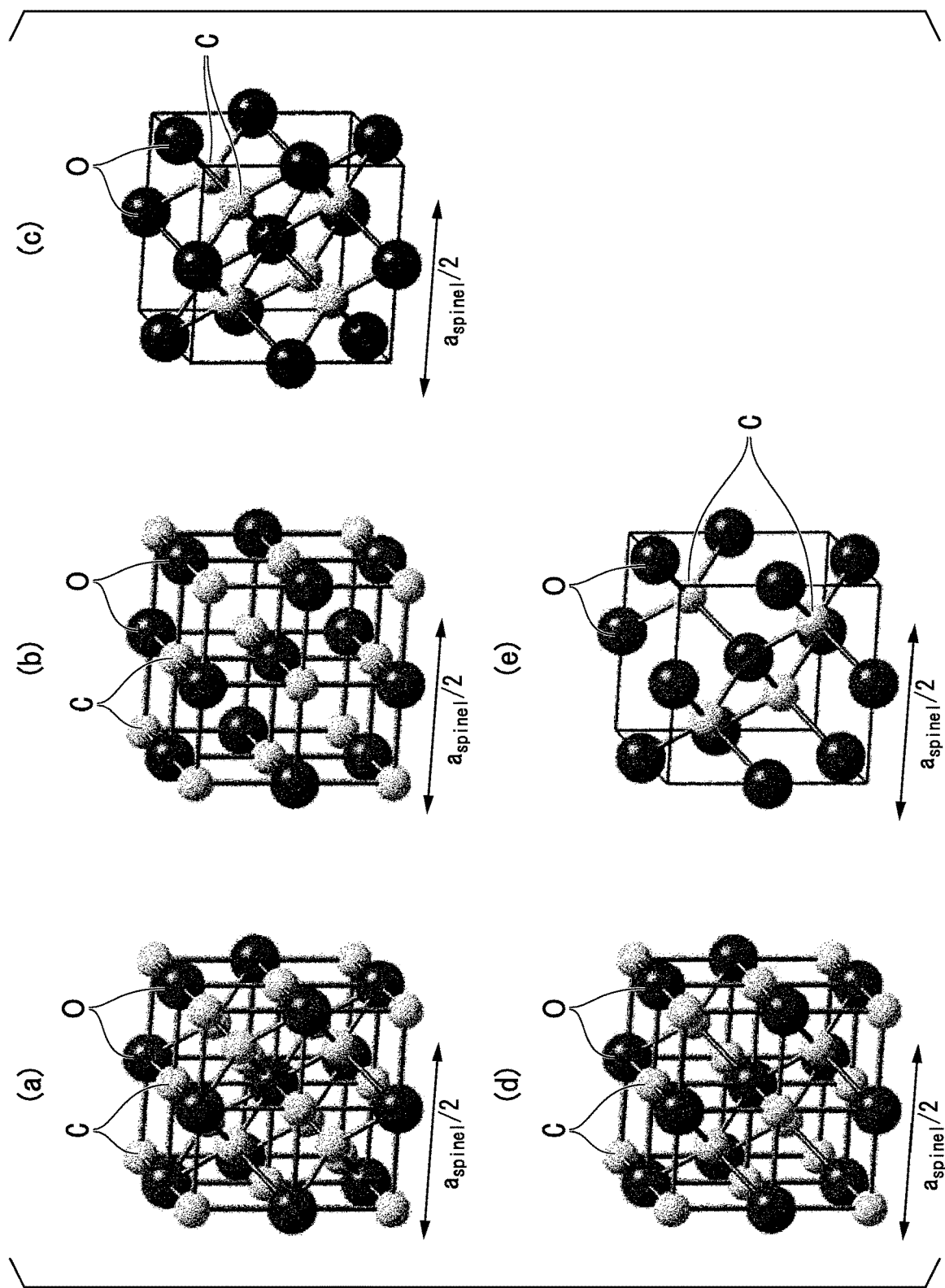
FIG. 3 is a view showing constituent units of the ordered spinel structure and the Sukenel structure.

FIG. 3 is a view showing constituent units of the ordered spinel structure and the Sukenel structure. The ordered spinel structure and the Sukenel structure can assume five constituent units shown in FIGS. 3(a) to 3(e). FIGS. 3(a) to 3(c) have symmetry of a space group of Fm-3m, and FIGS. 3(d) and 3(e) have symmetry of a space group of F-43m. The Sukenel structure may be formed by any of these structures or a mixture of these structures. In FIGS. 3(a) to 3(e), a reference sign O indicates an oxygen ion, a reference sign C indicates a site occupied by a cation, and a reference sign $a_{spinel}/2$ indicates a half of a lattice constant of the spinel structure and a lattice constant of the Sukenel structure. The site occupied by the cation corresponds to either the A site or the B site in FIG. 2.

For example, in the case where the tunnel barrier layer 3 is formed of $MgAl_2O_4$, $ZnAl_2O_4$, $MgGa_2O_4$, $ZnGa_2O_4$, $CdAl_2O_4$, or $CdGa_2O_4$, the A site becomes any of Mg, Zn, and Cd that are nonmagnetic divalent cations, and the B site becomes any of Al and Ga. In the case where the tunnel barrier layer 3 is formed of $\gamma$-$Al_2O_3$, the C sites are occupied by Al, some of which are defective.

When a repetitive unit of the lattice structure of the tunnel barrier layer 3 is changed, a combination with an electronic structure (a band structure) with a material of which the ferromagnetic metal layer is formed is changed, and a great TMR enhance caused by a coherent tunnel effect appears. For example, a space group of $MgAl_2O_4$ that is a nonmagnetic spinel material is Fd-3m, and a space group of the disordered spinel structure in which the lattice constant is reduced by half is changed into Fm-3m or F-43m.

(Underlayer)

The underlayer 4 may be formed on a surface of the substrate 11 which is close to the first ferromagnetic metal layer 1. When the underlayer 4 is provided, crystallinity such as crystal orientation, a grain size, or the like of each layer, inclusive of the first ferromagnetic metal layer 1 laminated on the substrate 11, can be controlled.

The underlayer 4 may have any of conductive and insulation properties, and a conductive material is preferably used when a current is carried to the underlayer 4.

For example, as one example, a layer that has a (001) oriented NaCl structure is formed of a nitride containing at least one element selected from the group consisting of Ti, Zr, Nb, V, Hf, Ta, Mo, W, B, Al, and Ce can be used in the underlayer 4.

As another example, a layer that is represented by a compositional formula of $ABO_3$ and is formed of a (002) oriented perovskite-based conductive oxide can be used in the underlayer 4. Here, the A site contains at least one element selected from the group consisting of Sr, Ce, Dy, La, K, Ca, Na, Pb, and Ba, and the B site contains at least one element selected from the group consisting of Ti, V, Cr, Mn, Fe, Co, Ni, Ga, Nb, Mo, Ru, Ir, Ta, Ce, and Pb.

As another example, a layer that has a (001) oriented NaCl structure and is formed of an oxide containing at least one element selected from the group consisting of Mg, Al, and Ce can be used in the underlayer 4.

As another example, a layer that has a (001) tetragonal or cubic structure and is formed of an oxide containing at least one element selected from the group consisting of Al, Cr, Fe, Co, Rh, Pd, Ag, Ir, Pt, Au, Mo, and W can be used in the underlayer 4.

The underlayer 4 is not limited to one layer, and may be obtained by laminating a plurality of layers of the aforementioned examples. By devising a constitution of the underlayer 4, each layer of the magnetoresistance effect element 10 can be increased in crystallinity, and be improved in a magnetic property.

(Cap Layer)

The cap layer 5 is preferably formed on a surface of the second ferromagnetic metal layer 2 which is located on the side opposite to the tunnel barrier layer 3. The cap layer 5 can inhibit diffusion of an element from the second ferromagnetic metal layer 2. The cap layer 5 contributes to crystal orientation of each layer of the magnetoresistance effect element 10. As a result, by providing the cap layer 5, magnetisms of the first and second ferromagnetic metal layers 1 and 2 of the magnetoresistance effect element 10 are stabilized, and the resistance of the magnetoresistance effect element 10 can be made low.

A material having high conductivity is preferably used in the cap layer 5. For example, Ru, Ta, Cu, Ag, Au, or the like can be used in the cap layer 5. The cap layer 5 is preferably formed of a nonmagnetic metal that has an atomic number greater than or equal to that of yttrium. When the cap layer 5 is formed of the nonmagnetic metal, spins are easily accumulated on the second ferromagnetic metal layer 2, and a high MR ratio can be realized.

The crystal structure of the cap layer 5 is preferably adequately set according to a crystal structure of the neighboring ferromagnetic metal layer. The thickness of the cap layer 5 is preferably 1 nm or more and 30 nm or less as long as it is in a range within which a strain relaxation effect is obtained and furthermore a reduction in MR ratio caused by shunt is not found.

A spin orbit torque wiring may be formed on the cap layer 5.

Here, the spin orbital torque wiring extends in a direction that intersects a laminating direction of the magnetoresistance effect element 10 (a vertical direction of FIG. 1), is electrically connected to a power supply that supplies a current to the spin orbital torque wiring in the direction that intersects the laminating direction of the magnetoresistance effect element 10, and serves as a spin injecting means that injects a pure spin current into the magnetoresistance effect element 10 along with the power supply.

The spin orbital torque wiring is formed of a material where the pure spin current is generated by a spin Hall effect when the current flows. Here, the spin Hall effect is a phenomenon in which the pure spin current is induced in a direction orthogonal to a direction of the current on the basis of a spin orbital interaction when the current flows to the material.

(Substrate)

The magnetoresistance effect element 10 is formed on the substrate 11. A material having excellent flatness is preferably used as the substrate 11. The substrate 11 differs according to a target product. For example, in the case of the MRAM, a circuit formed of a Si substrate under the magnetoresistance effect element can be used. Alternatively, in the case of the magnetic head, an AlTiC substrate that is easy to process can be used.

Next, a relationship between the layers constituting the magnetoresistance effect element 10 will be described specifically.

(Relation Between Tunnel Barrier Layer and First Ferromagnetic Metal Layer or Second Ferromagnetic Metal Layer)

A crystal surface for crystals constituting the tunnel barrier layer 3 and a crystal surface for crystals constituting the first ferromagnetic metal layer 1 or the second ferromagnetic metal layer 2 are matched to be inclined at 0° or 45° in at least a part of a crystal interface between the tunnel barrier layer 3 and the first ferromagnetic metal layer 1 or the second ferromagnetic metal layer 2 containing the soft magnetic material.

Here, the ferromagnetic layer formed of $Fe_2CoSi$ and the tunnel barrier layer 3 are matched. The second ferromagnetic metal layer 2 is formed of $Fe_2CoSi$ in the same manner as described above, and the matching of the second ferromagnetic metal layer 2 and the tunnel barrier layer 3 will be described below.

First, the case where the crystal surface for the crystals constituting the tunnel barrier layer 3 and the crystal surface for the crystals constituting the second ferromagnetic metal layer 2 are matched to be inclined at 0° will be described.

Figure 4:
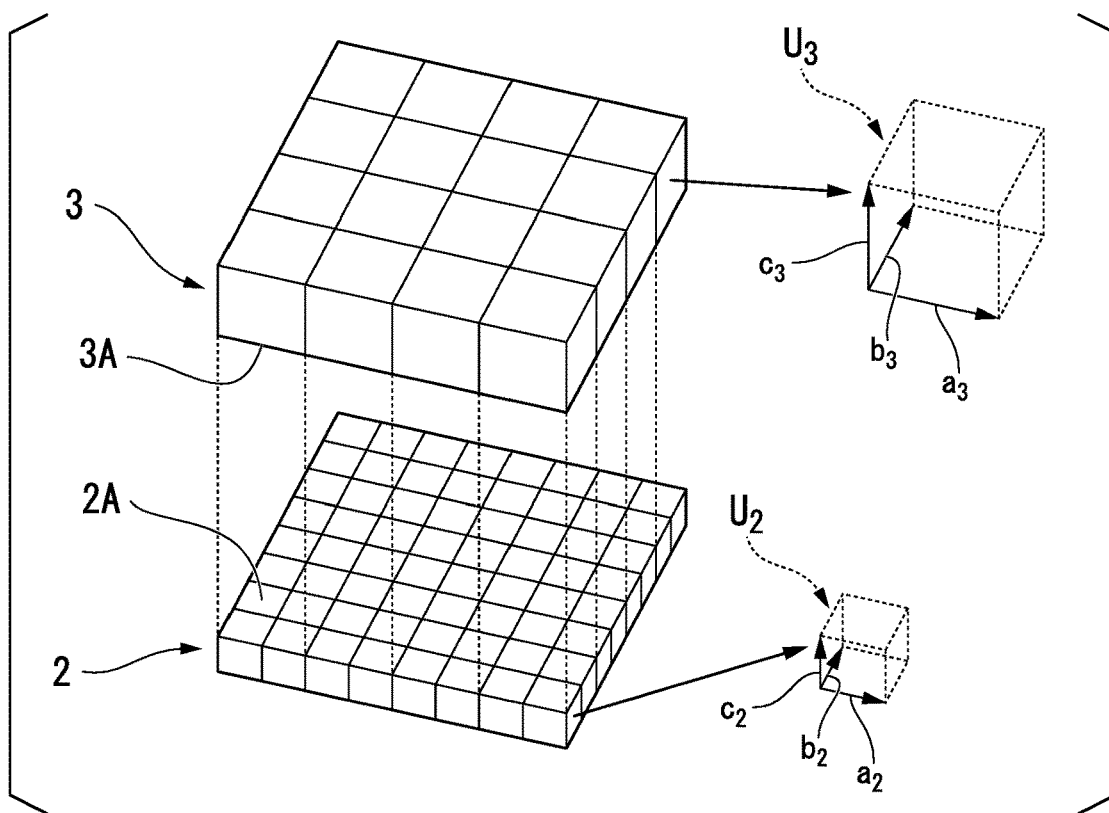
FIG. 4 is a perspective view schematically showing the case where a crystal surface for crystals constituting a tunnel barrier layer and a crystal surface for crystals constituting a second ferromagnetic metal layer are matched to be inclined at 0°.

FIG. 4 is a perspective view schematically showing the case where the crystal surface 3A for the crystals constituting the tunnel barrier layer 3 and the crystal surface 2A for the crystals constituting the second ferromagnetic metal layer 2 are matched to be inclined at 0°. To facilitate understanding, the crystal surface 3A for the crystals constituting the tunnel barrier layer 3 and the crystal surface 2A for the crystals constituting the second ferromagnetic metal layer 2 are shown separately. Enlarged views of unit lattices $U_3$ of the crystals constituting the tunnel barrier layer 3 and unit lattices $U_2$ of the crystals constituting the second ferromagnetic metal layer 2 are shown.

The tunnel barrier layer 3 is formed by densely arranging the unit lattices $U_3$. Each of the unit lattices $U_3$ of the tunnel barrier layer 3 has fundamental vectors of $<a_3, b_3,$ and $c_3>$. Since the tunnel barrier layer 3 has a cubic crystal, the fundamental vectors $a_3$, $b_3$, and $c_3$ are orthogonal to one another, and magnitudes of the fundamental vectors $a_3$, $b_3$, and $c_3$ are equal to one another.

Likewise, the second ferromagnetic metal layer 2 is formed by densely arranging the unit lattices $U_2$. Each of the unit lattices $U_2$ of the second ferromagnetic metal layer 2 has fundamental vectors of $<a_2, b_2,$ and $c_2>$. Since the second ferromagnetic metal layer 2 also has a cubic crystal, the fundamental vectors $a_2$, $b_2$, and $c_2$ are orthogonal to one another, and magnitudes of the fundamental vectors $a_2$, $b_2$, and $c_2$ are equal to one another.

The case where the crystal surface 3A for the crystals constituting the tunnel barrier layer 3 and the crystal surface 2A for the crystals constituting the second ferromagnetic metal layer 2 are matched to be inclined at 0° satisfies the two following conditions.

The first condition is that directions of the fundamental vectors $a_3$ and $b_3$ constituting the crystal surface 3A correspond to those of the fundamental vectors $a_2$ and $b_2$ constituting the crystal surface 2A.

The second condition is that the magnitudes of the fundamental vectors $a_3$ and $b_3$ constituting the crystal surface 3A are positive integral multiples or the reciprocals of positive integral multiples of those of the fundamental vectors $a_2$ and $b_2$ constituting the crystal surface 2A (or can approximate positive integral multiples or the reciprocals of positive integral multiples of those of the fundamental vectors $a_2$ and $b_2$). That is, the second condition satisfies $|a_3|=n|a_2|$ (where n is a positive integer or the reciprocal of a positive integer) . . . (1). Since the magnitudes of the fundamental vectors of the unit lattice are equal to each other, the second condition satisfies $|b_3|=n|b_2|$ if it satisfies General Formula (1).

When the first condition is satisfied, directions of sides of the unit lattices $U_2$ and $U_3$ constituting the two crystal surfaces 2A and 3A correspond to each other. As a result, as shown in FIG. 4, the unit lattice $U_3$ of the cubic crystal of the tunnel barrier layer 3 is formed on the unit lattice $U_2$ of the cubic crystal of the second ferromagnetic metal layer 2 by arranging the sides (this may be referred to hereinafter as cubic on cubic (CoC)).

Figure 5:
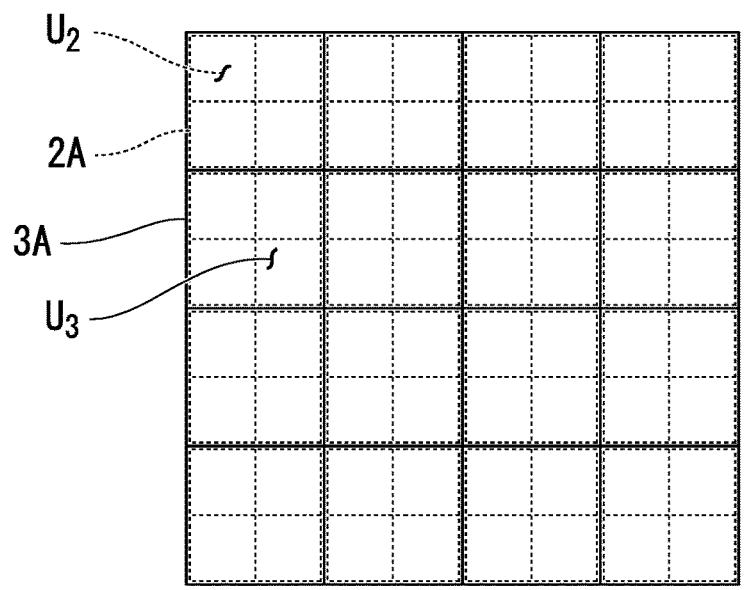
FIG. 5 is a top view schematically showing the case where the crystal surface for the crystals constituting the tunnel barrier layer and the crystal surface for the crystals constituting the second ferromagnetic metal layer are matched to be inclined at 0°.

As shown in FIG. 5, when the second condition is satisfied, apex positions of the unit lattice $U_2$ and the unit lattice $U_3$ are arranged once at at least several periods when viewed in the laminating direction of the magnetoresistance effect element 10. FIG. 5 is a top view schematically showing the case where the crystal surface 3A for the crystals constituting the tunnel barrier layer 3 and the crystal surface 2A for the crystals constituting the second ferromagnetic metal layer 2 are matched to be inclined at 0° (a schematic view of the crystal interface between the crystal surface 3A and the crystal surface 2A). In FIG. 5, a solid line indicates the crystal surface 3A for the crystals constituting the tunnel barrier layer 3, and a dotted line indicates the crystal surface 2A for the crystals constituting the second ferromagnetic metal layer 2.

In the crystal structure of the cubic crystal, atoms are disposed at the apex positions of the unit lattice. For this reason, when the apex positions of the unit lattice $U_2$ and the unit lattice $U_3$ are arranged once at at least several periods, atoms of the second ferromagnetic metal layer 2 and atoms of the tunnel barrier layer 3 are arranged at overlapping positions when viewed in the laminating direction. For this reason, in the crystal interface between the second ferromagnetic metal layer 2 and the tunnel barrier layer 3, the atoms are connected at the overlapping positions in the laminating direction, and the second ferromagnetic metal layer 2 and the tunnel barrier layer 3 are matched without generating lattice strain.

Here, the degree of the matching between the second ferromagnetic metal layer 2 and the tunnel barrier layer 3 can be expressed by an index that indicates a degree of lattice matching. The degree of lattice matching can be defined as follows.

[Math. 1]

$$\text{Degree of lattice matching} = \frac{\|a_3\| - n|a_2\|}{|a_2|} \times 100 \quad (2)$$

In General Formula (2), $|a_3|$ is the magnitude of the fundamental vector of the tunnel barrier layer 3 (the magnitude of the unit lattice), that is, the lattice constant and $|a_2|$ is the magnitude of the fundamental vector of the second ferromagnetic metal layer 2 (the magnitude of the unit lattice), that is, the lattice constant. In addition, n is a positive integer or the reciprocal of a positive integer. A value of n for which the value of $n \times |a_2|$ is closest to $|a_3|$ is selected.

The degree of lattice matching between the second ferromagnetic metal layer 2 and the tunnel barrier layer 3 is preferably 10 or less, and more preferably 5 or less. It is preferred that n=1. If n=1, the apex positions of the unit lattice $U_2$ and the unit lattice $U_3$ correspond one-to-one.

Next, the case where the crystal surface 3A for the crystals constituting the tunnel barrier layer 3 and the crystal surface 2A for the crystals constituting the second ferromagnetic metal layer 2 are matched to be inclined at 45° will be described.

Figure 6:
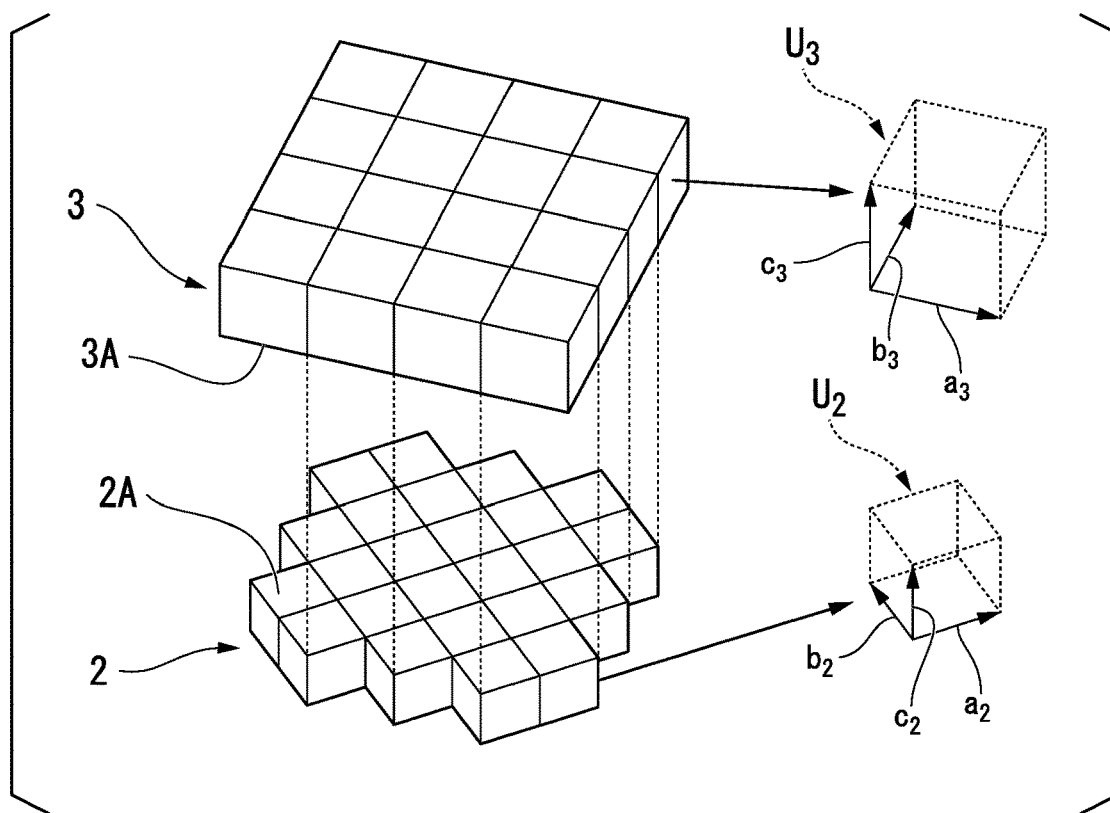
FIG. 6 is a perspective view schematically showing the case where the crystal surface for the crystals constituting the tunnel barrier layer and the crystal surface for the crystals constituting the second ferromagnetic metal layer are matched to be inclined at 45°.

FIG. 6 is a perspective view schematically showing the case where the crystal surface 3A for the crystals constituting the tunnel barrier layer 3 and the crystal surface 2A for the crystals constituting the second ferromagnetic metal layer 2 are matched to be inclined at 45°. To facilitate understanding, it is shown that the crystal surface 3A for the crystals constituting the tunnel barrier layer 3 and the crystal surface 2A for the crystals constituting the second ferromagnetic metal layer 2 are separated. It is shown that unit lattices $U_3$ of the crystals constituting the tunnel barrier layer 3 and unit lattices $U_2$ of the crystals constituting the second ferromagnetic metal layer 2 are enlarged.

The case where the crystal surface 3A for the crystals constituting the tunnel barrier layer 3 and the crystal surface 2A for the crystals constituting the second ferromagnetic metal layer 2 are matched to be inclined at 45° satisfies the two following conditions.

The first condition is that directions of the fundamental vectors $a_3$ and $b_3$ constituting the crystal surface 3A and directions of the fundamental vectors $a_2$ and $b_2$ constituting the crystal surface 2A are inclined at 45° with respect to an axis parallel to the laminating direction. In other words, the direction of the fundamental vector $c_3$ constituting the crystal surface 3A and the direction of the fundamental vector $c_2$ constituting the crystal surface 2A correspond to each other, and an angle formed by the fundamental vector $a_3$ constituting the crystal surface 3A and the fundamental vector $a_2$ constituting the crystal surface 2A is 45°.

The second condition is that the magnitudes of the fundamental vectors $a_3$ and $b_3$ constituting the crystal surface 3A are positive integral multiples or the reciprocals of positive integral multiples of values obtained by multiplying the magnitudes of the fundamental vectors $a_2$ and $b_2$ constituting the crystal surface 2A by $2^{1/2}$ (or can approximate positive integral multiples or the reciprocals of positive integral multiples of the values obtained by multiplying the magnitudes of the fundamental vectors $a_2$ and $b_2$ by $2^{1/2}$). That is, the second condition satisfies $|a_3|=n|2^{1/2} \cdot a_2|$ (where n is a positive integer or the reciprocal of a positive integer) . . . (3). Since the magnitudes of the fundamental vectors of the unit lattice are equal to each other, the second condition satisfies $|b_3|=n|2^{1/2} \cdot b_2|$ if it satisfies General Formula (3).

Figure 7:
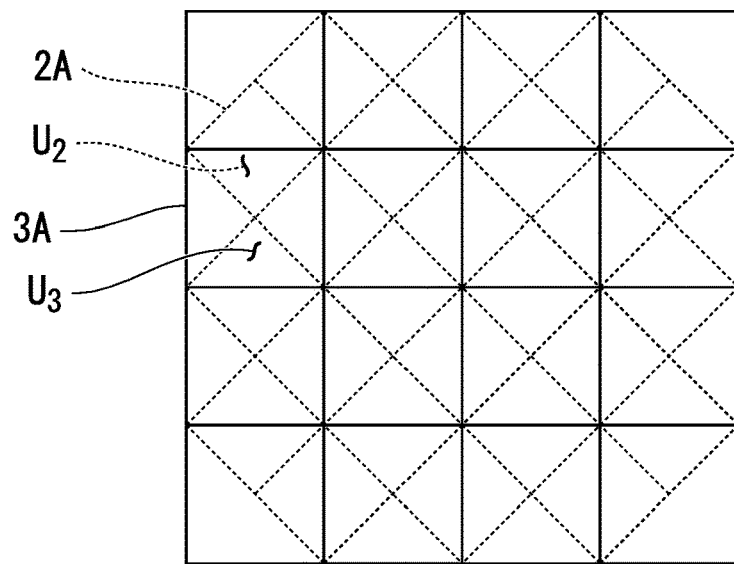
FIG. 7 is a top view schematically showing the case where the crystal surface for the crystals constituting the tunnel barrier layer and the crystal surface for the crystals constituting the second ferromagnetic metal layer are matched to be inclined at 45°.

When the first condition is satisfied, a unit lattice plane constituting the crystal surface 2A rotates by an inclination of 45° about an axis parallel to the laminating direction with respect to a unit lattice plane constituting the crystal surface 3A. That is, as shown in FIG. 7, a direction of a diagonal line of the unit lattice plane constituting the crystal surface 2A corresponds to a direction of a side of the unit lattice plane constituting the crystal surface 3A. FIG. 7 is a top view schematically showing the case where the crystal surface 3A for the crystals constituting the tunnel barrier layer 3 and the crystal surface 2A for the crystals constituting the second ferromagnetic metal layer 2 are matched to be inclined at 45° (a schematic view of the crystal interface between the crystal surface 3A and the crystal surface 2A). In FIG. 5, a solid line indicates the crystal surface 3A for the crystals constituting the tunnel barrier layer 3, and a dotted line indicates the crystal surface 2A for the crystals constituting the second ferromagnetic metal layer 2.

As a result, as shown in FIG. 6, the unit lattice $U_3$ of the cubic crystal of the tunnel barrier layer 3 is laminated on the unit lattice $U_2$ of the cubic crystal of the second ferromagnetic metal layer 2 by an inclination of 45° with respect to the axis parallel to the laminating direction (this may be referred to hereinafter as R45 (rotation of 45°)).

As shown in FIG. 7, when the second condition is satisfied, apex positions of the unit lattice $U_2$ in a diagonal direction and apex positions of the unit lattice $U_3$ in a side direction are arranged once at at least several periods when viewed in the laminating direction of the magnetoresistance effect element 10.

As described above, the atoms are disposed at the apex positions of the unit lattice in the crystal structure of the cubic crystal. For this reason, when the apex positions of the unit lattice $U_2$ and the unit lattice $U_3$ are arranged once at at least several periods, the atoms of the second ferromagnetic metal layer 2 and the atoms of the tunnel barrier layer 3 are arranged at overlapping positions when viewed in the laminating direction. For this reason, in the crystal interface between the second ferromagnetic metal layer 2 and the tunnel barrier layer 3, the atoms are connected at the overlapping positions in the laminating direction, and the second ferromagnetic metal layer 2 and the tunnel barrier layer 3 are matched without generating the lattice strain.

So far, the case where the unit lattice $U_2$ of the second ferromagnetic metal layer 2 and the unit lattice $U_3$ of the tunnel barrier layer 3 in the crystal interface between the second ferromagnetic metal layer 2 and the tunnel barrier layer 3 are laminated by ConC or R45 has been described. However, the pictures of the crystal interfaces shown in FIGS. 4 and 6 are to model a certain micro point. For this reason, in a more macro viewpoint, a certain portion of the crystal interface may be laminated by ConC, and the other portion may be laminated by R45. That is, in the crystal interface between the second ferromagnetic metal layer 2 and the tunnel barrier layer 3, a portion where the crystal surfaces are matched to be inclined at 0° and a portion where the crystal surfaces are matched to be inclined at 45° may be mixed.

A laminated state of a favorable crystal interface which the second ferromagnetic metal layer 2 formed of $Fe_2CoSi$ and the tunnel barrier layer 3 can assume with respect to a specific material of which the tunnel barrier layer 3 will be described.

In the case where the tunnel barrier layer 3 is formed of MgO, $MgAl_2O_4$, $\gamma$-$Al_2O_3$, $ZnAl_2O_4$, or any of mixed crystal materials thereof, the second ferromagnetic metal layer 2 and the tunnel barrier layer 3 preferably satisfy the relation of R45. By satisfying this relation, the degree of lattice matching enters within 10%.

In the case where the tunnel barrier layer is formed of $MgGa_2O_4$, $ZnGa_2O_4$, $CdAl_2O_4$, or any of mixed crystal materials thereof, the second ferromagnetic metal layer 2 and the tunnel barrier layer 3 preferably satisfy the relation where ConC and R45 are mixed although they satisfy the relation of ConC or the relation of R45. By satisfying this relation, the degree of lattice matching enters within 10%.

In the case where the tunnel barrier layer is formed of $ZnGa_2O_4$, $CdAl_2O_4$, or any of mixed crystal materials thereof, and the second ferromagnetic metal layer 2 and the tunnel barrier layer 3 satisfy the relation of ConC, the degree of lattice matching particularly preferably enters within 5%.

Furthermore, in the case where the tunnel barrier layer is formed of $CdGa_2O_4$, the second ferromagnetic metal layer 2 and the tunnel barrier layer 3 preferably satisfy the relation of ConC. By satisfying this relation, the degree of lattice matching enters within 10%.

As described above, in the magnetoresistance effect element 10 according to the present embodiment, the unit lattices are laminated in at least a part of the crystal interface between the tunnel barrier layer 3 and the first ferromagnetic metal layer 1 or the second ferromagnetic metal layer 2 containing the soft magnetic material in the state of ConC, R45, or a mixture thereof. For this reason, the degree of lattice matching is reduced, and the lattice strain in the magnetoresistance effect element 10 is reduced. As a result, the magnetoresistance effect element 10 that contains $Fe_2CoSi$ that is the soft magnetic material and has a high MR ratio can be obtained.

To obtain this effect, a portion where lattice images of the first ferromagnetic metal layer 1, the second ferromagnetic metal layer 2, and the tunnel barrier layer 3 which are obtained from a transmission electron microscope (TEM) image are continuously connected in the laminating direction may be one or more. In detail, the first ferromagnetic metal layer 1, the second ferromagnetic metal layer 2, and the tunnel barrier layer 3 are photographed by the TEM first, and Fourier transform and inverse Fourier transform are performed on the obtained TEM image. Thereby, the TEM image is used as an image that extracts information in the laminating direction only. In the portion where the lattice images of the first ferromagnetic metal layer 1, the second ferromagnetic metal layer 2, and the tunnel barrier layer 3 are continuously connected in the laminating direction, the relation of any one or both of ConC and R45 is satisfied. Since a coherent tunnel occurs at this portion, a great MR ratio can be obtained because the portion is one or more. In at least 90% or more of the crystal interface between the tunnel barrier layer 3 and the first ferromagnetic metal layer 1 or the second ferromagnetic metal layer 2 (an area ratio or a ratio of the portion where the aforementioned lattice images are continuously connected in the laminating direction), the crystal surface 3A for the crystals constituting the tunnel barrier layer 3 and the crystal surface 2A for the crystals constituting the second ferromagnetic metal layer 2 are preferably matched in the state of ConC, R45, or a mixture thereof. In the whole crystal interfaces, the crystal surfaces are more preferably matched in the state of ConC, R45, or a mixture thereof.

(Shape and Dimensions of Element)

The laminate made up of the first ferromagnetic metal layer 1, the tunnel barrier layer 3, and the second ferromagnetic metal layer 2 constituting the magnetoresistance effect element 10 has a columnar shape. The shape of the laminate in the top view can assume various shapes such as a circular shape, a quadrangular shape, a triangular shape, a polygonal shape, and the like, but it is preferably a circular shape from a symmetrical surface. That is, the laminate preferably has a cylindrical shape.

In the case where the laminate has a cylindrical shape, a diameter thereof in the top view is preferably 80 nm or less, more preferably 60 nm or less, and most preferably 30 nm or less. When the diameter is 80 nm or less, a domain structure is not easily produced in the ferromagnetic metal layer, and there is a need to consider a component different from spin polarization in the ferromagnetic metal layer. Furthermore, when the diameter is 30 nm or less, a single domain structure is produced in the ferromagnetic metal layer, and a magnetization reverse speed or probability is improved. Especially, a request to make resistance low is strong in a miniaturized magnetoresistance effect element.

(Constitution During Use)

Figure 8:
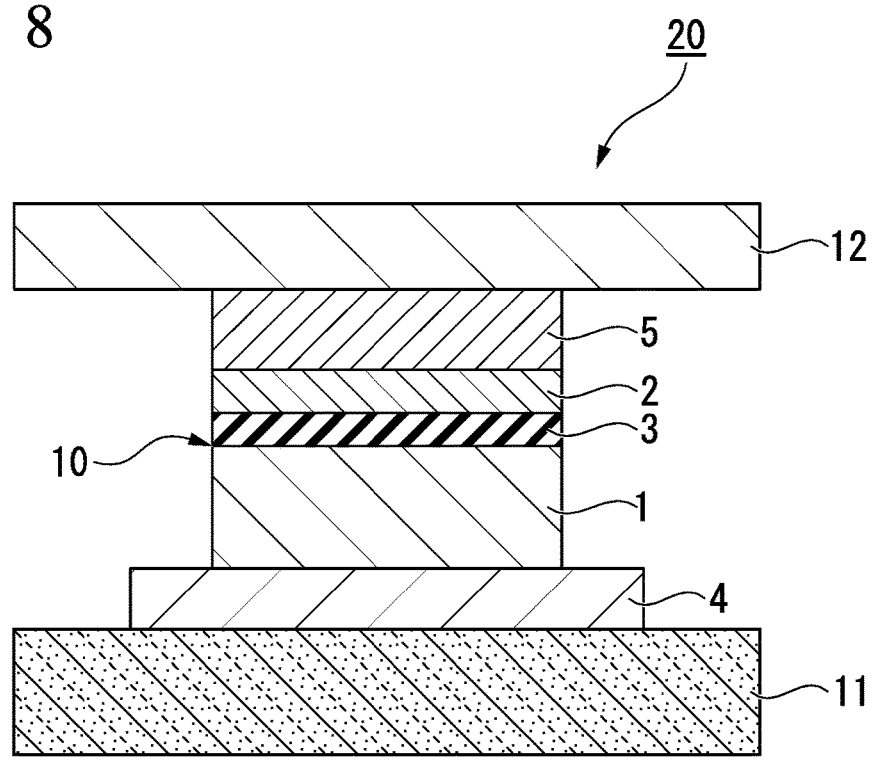
FIG. 8 is a schematic sectional view of a magnetoresistance effect device having the magnetoresistance effect element according to an aspect of the present invention.
Figure 9:
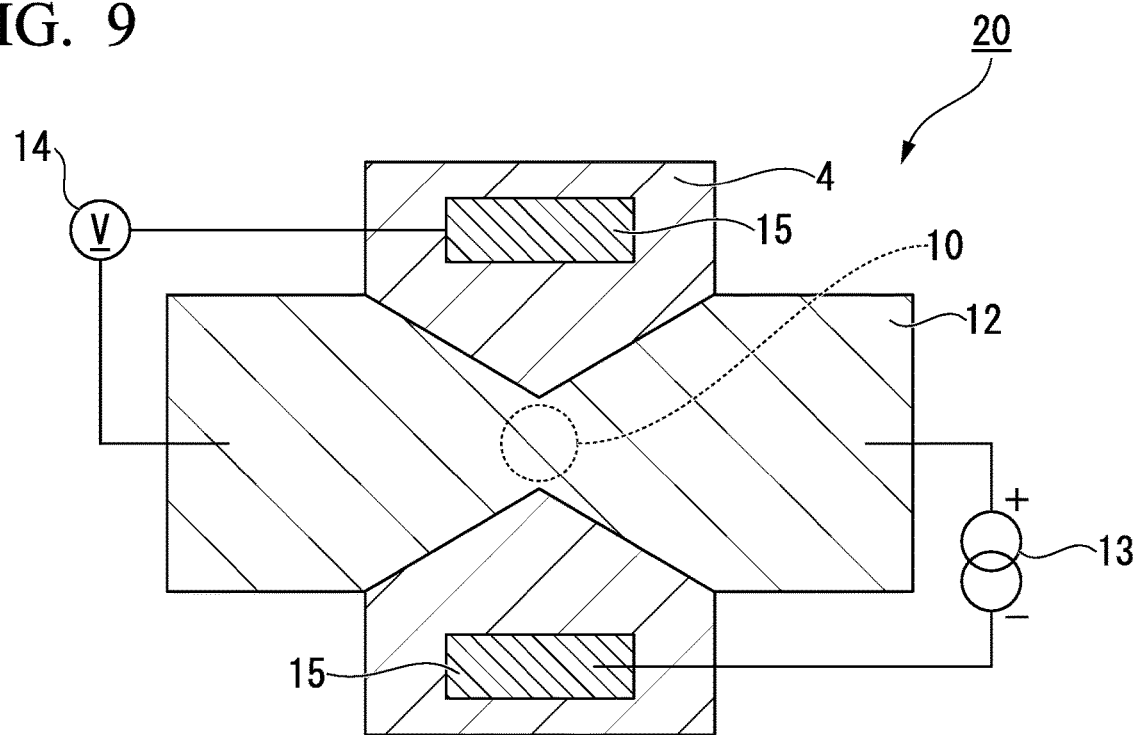
FIG. 9 is a schematic view of the magnetoresistance effect device from above in a laminating direction.

FIG. 8 is a schematic sectional view of a magnetoresistance effect device having the magnetoresistance effect element according to an aspect of the present invention. FIG. 9 is a schematic view of the magnetoresistance effect device from above in the laminating direction. A magnetoresistance effect device 20 has an electrode layer 12 formed on a surface of the cap layer 5 shown in FIG. 1 in which the surface of the cap layer 5 is located on the side opposite to the second ferromagnetic metal layer 2. An underlayer 4 has conductivity, and is arranged to intersect the electrode layer 12. A power supply 13 and a voltmeter 14 are provided between the underlayer 4 and the electrode layer 12. The underlayer 4 and the power supply 13, and the underlayer 4 and the voltmeter 14 are connected via contact electrodes 15. A voltage is applied to the underlayer 4 and the electrode layer 12 by the power supply 13, and thereby a current flows in a laminating direction of a laminate made up of a first ferromagnetic metal layer 1, a tunnel barrier layer 3, and a second ferromagnetic metal layer 2. The voltage applied at this time is monitored by the voltmeter 14.

(Evaluating Method)

An evaluating method of the magnetoresistance effect element will be described using FIGS. 8 and 9 by way of example. As described above, as shown in FIG. 9, the power supply 13 and the voltmeter 14 are disposed, and a constant current or a constant voltage is applied to the magnetoresistance effect element. The voltage or the current is measured while sweeping a magnetic field from the outside, and thereby a change in resistance of the magnetoresistance effect element is observed.

An MR ratio is generally expressed by the following formula.

MR ratio (%)=$(R_{AP}-R_P)/R_P \times 100$ $R_P$ is a resistance when the magnetization directions of the first ferromagnetic metal layer 1 and the second ferromagnetic metal layer 2 are parallel, and $R_{AP}$ is a resistance when the magnetization directions of the first ferromagnetic metal layer 1 and the second ferromagnetic metal layer 2 are antiparallel.

In this way, the magnetoresistance effect element using the present embodiment can be used as a magnetic sensor or a memory such as MRAM.

(Manufacturing Method)

The underlayer 4, the first ferromagnetic metal layer 1, the tunnel barrier layer 3, the second ferromagnetic metal layer 2, and the cap layer 5 constituting the magnetoresistance effect element 10 are formed using, for instance, a magnetron sputtering apparatus.

The underlayer 4 can be formed by a well-known method. For example, the underlayer 4 can be formed by a reactive sputtering method using a mixed gas including Ar and nitrogen as a sputtering gas. The first ferromagnetic metal layer 1 can be formed by a well-known method. For example, the first ferromagnetic metal layer 1 can be formed on the underlayer 4 by a thin film forming method such as a sputtering method, a vapor deposition method, a laser application method, an MBE method, or the like.

The tunnel barrier layer 3 can be formed by a well-known method. For example, the tunnel barrier layer 3 can be formed by sputtering a metal thin film on the first ferromagnetic metal layer 1, performing natural oxidation caused by plasma oxidation or oxygen introduction, and performing a subsequent heat treatment. In addition to a magnetron sputtering method, a typical thin film forming method such as a vapor deposition method, a laser application method, an MBE method, or the like can be used as the film forming method.

Next, the second ferromagnetic metal layer 2 formed of $Fe_2CoSi$ is formed on the tunnel barrier layer 3. In addition to a magnetron sputtering method, a typical thin film forming method such as a vapor deposition method, a laser application method, an MBE method, or the like can be used as the film forming method.

In this case, the case where a junction interface between the tunnel barrier layer 3 and the second ferromagnetic metal layer 2 is put into a matched state of R45 is performed at a temperature higher than or equal to at least 300 degrees that is a temperature when the second ferromagnetic metal layer 2 is formed. The case where the junction interface is put into a matched state of ConC is also performed at a temperature higher than or equal to at least 300 degrees that is a temperature when the second ferromagnetic metal layer 2 is formed. Furthermore, the case where the junction interface is put into a mixed state of R45 and ConC is performed at a temperature lower than at least 300 degrees that is a temperature when the second ferromagnetic metal layer 2 is formed. The joined states can be changed by adjusting the temperature at the time of film formation.

The cap layer 5 is formed on the obtained second ferromagnetic metal layer 2 by a well-known method. A lamination film in which the underlayer 4, the first ferromagnetic metal layer 1, the tunnel barrier layer 3, the second ferromagnetic metal layer 2, and the cap layer 5 are laminated in turn is obtained.

The obtained lamination film is preferably annealed. A layer formed by reactive sputtering is amorphous, and requires crystallization. For example, in the case where Co—Fe—B is used as the ferromagnetic metal layer, B is partly removed and crystallized by an annealing treatment.

The magnetoresistance effect element 10 manufactured by an annealing treatment is improved in MR ratio compared to the magnetoresistance effect element 10 manufactured without an annealing treatment. This is thought to be because the underlayer 4 is partly crystallized by the annealing treatment, and thereby uniformity and orientation of crystal sizes of the tunnel barrier layer 3 are improved.

As the annealing treatment, the magnetoresistance effect element 10 is preferably heated in an inert atmosphere such as Ar at a temperature of 300° C. or higher and 500° C. or lower for a time of 5 min or more and 100 min or less, and then is heated at a temperature of 100° C. or higher and 500° C. or lower for a time of 1 hour or more and 10 hours or less in a state in which a magnetic field of 2 kOe or higher and 10 kOe or lower (159 kA/m or higher and 796 kA/m or lower) is applied.

EXAMPLES (Degree of Lattice Matching)

A lattice constant of $Fe_2CoSi$ serving as the second ferromagnetic metal layer and a lattice constant of MgO, $MgAl_2O_4$, γ-$Al_2O_3$, $ZnAl_2O_4$, $MgGa_2O_4$, $ZnGa_2O_4$, $CdAl_2O_4$, and $CdGa_2O_4$ serving as the tunnel barrier layer were obtained, and a degree of lattice matching between the second ferromagnetic metal layer and the tunnel barrier layer that were matched by CoC and a degree of lattice matching between the second ferromagnetic metal layer and the tunnel barrier layer that were matched by R45 were obtained. The obtained results are given in Table 1.

The lattice constants of $Fe_2CoSi$ and the tunnel barrier layer were evaluated using a 4-axis X-ray diffractometer. In the evaluation of the lattice constants, it was difficult to determine the lattice constants at film thicknesses of the second ferromagnetic metal layer and the tunnel barrier layer of examples to be described below.

For this reason, a substrate in which the tunnel barrier layer (a thickness of 100 nm) was formed on a Si substrate with a thermally oxidized film in order to obtain the lattice constant as preliminary measurement was used. The Si substrate with a thermally oxidized film had a surface that was of amorphous $SiO_x$, and was difficult to receive an influence when the tunnel barrier layer was formed. The tunnel barrier layer (a thickness of 100 nm) was a film thickness at which an influence of lattice strain caused by the substrate was sufficiently relaxed, and was a film thickness at which X-ray strength for sufficient structure analysis could be obtained.

The film thickness obtained in the example did not completely correspond to that of the preliminary measurement, but represented the same value. The lattice constant obtained from the preliminary measurement could be regarded as the lattice constant obtained in the example. The tunnel barrier layer has a lattice constant as a rock salt structure in the case of MgO or a spinel structure in the case of other materials.

TABLE 1

| Second ferromagnetic metal layer | Tunnel barrier layer | Degree of lattice matching | |
|---|---|---|---|
| | | Joined state: CoC | Joined state: R45 |
| $Fe_2CoSi$ | MgO | 49.42 | 5.66 |
| | $MgAl_2O_4$ | 13.32 | 2.71 |
| | $\gamma\text{-}Al_2O_3$ | 19.45 | 1.62 |
| | $ZnAl_2O_4$ | 14.06 | 2.19 |
| | $MgGa_2O_4$ | 6.19 | 7.76 |
| | $ZnGa_2O_4$ | 4.38 | 9.03 |
| | $ZnIn_2O_4$ | 16.71 | 23.95 |
| | $CdAl_2O_4$ | 3.67 | 9.54 |
| | $CdGa_2O_4$ | 5.55 | 16.06 |

Next, the magnetoresistance effect element was actually formed, and an MR ratio of the magnetoresistance effect element was measured. The actual measurement of the MR ratio is performed on a part of a combination of a matched state between the tunnel barrier layer and the crystal interface.

Example 1

Each layer of the magnetoresistance effect element was formed on the substrate on which a thermally oxidized silicon layer was provided using a magnetron sputtering method.

First, Ta (5 nm)/Ru (3 nm) was formed as the underlayer. Afterward, IrMn (12 nm)/CoFe (10 nm)/Ru (0.8 nm)/CoFe (7 nm) were sequentially laminated on the underlayer as the first ferromagnetic metal layer.

Next, MgO acting as the tunnel barrier layer was laminated on the first ferromagnetic metal layer, and $Fe_2CoSi$ acting as the second ferromagnetic metal layer was laminated. The thickness of the tunnel barrier layer was set to a thickness (Å) given in Table 2, and a thickness of $Fe_2CoSi$ was set to 3 nm. The matched state (the joined state) between the tunnel barrier layer and the second ferromagnetic metal layer was R45. The fact that the matched state was R45 was confirmed from values of the lattice constants of the tunnel barrier layer and the second ferromagnetic metal layer, and a portion where the lattice images of the tunnel barrier layer and the second ferromagnetic metal layer, which were obtained from the TEM image, were continuously connected in the laminating direction. To put the matched state between the tunnel barrier layer and the second ferromagnetic metal layer into R45, the film formation was performed by setting a temperature of the substrate at the time of film formation to 350 degrees.

Furthermore, a laminate in which Ru (3 nm)/Ta (5 nm) were formed on the second ferromagnetic metal layer as the cap layer was obtained. The obtained laminate was installed in an annealing apparatus, was treated in Ar at a temperature of 450° C. for 10 minutes, and then was treated at a temperature of 280° C. for 6 hours in a state in which 8 kOe was applied.

Next, the elements having the constitutions shown in FIGS. 8 and 9 were formed. First, the electrode layer 12 was formed on the cap layer 5. Next, a photoresist was formed using an electron beam lithography to be a direction in which the electrode layer 12 rotates at 90 degrees. The shape of the underlayer 4 was formed by removing the other portion under the photoresist by an ion milling method, and exposing the thermally oxidized silicon film that is the substrate. Furthermore, the underlayer 4 was exposed by forming a photoresist at a narrowed portion of the shape of the underlayer 4 to become a cylindrical shape of 80 nm using the electron beam lithography, and removing the other portion under the photoresist by the ion milling method. Afterward, the underlayer 4 was formed at a portion that is cut by ion milling using $SiO_x$ as an insulating layer. The photoresist of the cylindrical shape of 80 nm was removed here. The photoresist was configured such that the photoresist was not formed at only the portion of the contact electrode 15 of FIGS. 6 and 7, and the insulating layer was removed by the ion milling method, and the underlayer 4 was exposed. Afterward, the contact electrode 15 was formed by forming Au.

Comparative Example 1

Comparative Example 1 was the same as Example 1 except that the relation between the tunnel barrier layer and the second ferromagnetic metal layer was set as ConC. A film was formed by setting the temperature of the substrate during film formation to 250 degrees, and thereby a matched state between the tunnel barrier layer and the second ferromagnetic metal layer became a state with no epitaxial growth. The state with no epitaxial growth was a state in which an interface between the tunnel barrier layer and the second ferromagnetic metal layer were not arranged, and might be a state in which the crystal interface was any of R45, ConC, and a mixture of R45 and ConC. That is, in the crystal interface, the second ferromagnetic metal layer was a polycrystalline state in which it did not have an orientation determined with respect to the tunnel barrier layer. This could be understood that, when the second ferromagnetic metal layer was formed on the tunnel barrier layer, the second ferromagnetic metal layer was not given sufficient thermal energy, and thus a crystal orientation could not be rearranged on the tunnel barrier layer. In this way, in Comparative Example 1, the crystal surfaces were not matched in the crystal interface between the tunnel barrier layer and the second ferromagnetic metal layer, and a relation between the unit lattice of the tunnel barrier layer and the unit lattice of the second ferromagnetic metal layer was configured to become ConC.

Reference Example 1

Reference Example 1 was the same as Example 1 except that the second ferromagnetic metal layer was formed of Fe. A lattice constant of Fe was 4.053, and a degree of lattice matching was 3.9 when a matched state was R45.

Example 2

A magnetoresistance effect element was formed in the same way as in Example 1 except that the tunnel barrier layer was formed of $MgAl_2O_4$. A film was formed by setting the temperature of the substrate during film formation to 380 degrees, and thereby a matched state between the tunnel barrier layer and the second ferromagnetic metal layer was set to R45.

Comparative Example 2

Comparative Example 2 was the same as Example 2 except that a matched state between the tunnel barrier layer and the second ferromagnetic metal layer was set to ConC. A film was formed by setting the temperature of the substrate during film formation to 280 degrees, and thereby the matched state between the tunnel barrier layer and the second ferromagnetic metal layer was set to ConC.

Example 3

A magnetoresistance effect element was formed in the same way as in Example 1 except that the tunnel barrier layer was formed of $ZnGa_2O_4$. After a film was formed by setting the temperature of the substrate during film formation to 280 degrees, the film was raised to 360 degrees, was maintained for 30 minutes, and was elevated to a high temperature. Thereby, a matched state between the tunnel barrier layer and the second ferromagnetic metal layer was set to R45.

Example 4

Example 4 was the same as Example 3 except that a matched state between the tunnel barrier layer and the second ferromagnetic metal layer was set to ConC. A film was formed by setting a temperature of the substrate during film formation to 360 degrees, and thereby the matched state between the tunnel barrier layer and the second ferromagnetic metal layer was set to ConC.

Example 5

Example 5 was the same as Example 3 except that a matched state between the tunnel barrier layer and the second ferromagnetic metal layer was set to a mixture of ConC and R45. A film was formed by setting a temperature of the substrate during film formation to 280 degrees, and thereby the matched state between the tunnel barrier layer and the second ferromagnetic metal layer was set to the mixture of ConC and R45. In the case where the matched state was the mixture of ConC and R45, the degree of lattice matching was changed according to a ratio between the mixed ConC and R45. For this reason, a specific degree of lattice matching was not calculated.

Example 6

A magnetoresistance effect element was formed in the same way as in Example 1 except that the tunnel barrier layer was formed of $Mg_{0.5}Zn_{0.5}Ga_2O_4$ that was a mixed crystal of $MgGa_2O_4$ and $ZnGa_2O_4$. After a film was formed by setting a temperature of the substrate during film formation to 280 degrees, the film was raised to 365 degrees, was maintained for 30 minutes, and was elevated to a high temperature. Thereby, a matched state between the tunnel barrier layer and the second ferromagnetic metal layer was set to R45.

Example 7

Example 7 was the same as Example 6 except that a matched state between the tunnel barrier layer and the second ferromagnetic metal layer was set to ConC. A film was formed by setting a temperature of the substrate during film formation to 365 degrees, and thereby the matched state between the tunnel barrier layer and the second ferromagnetic metal layer was set to ConC.

Example 8

Example 8 was the same as Example 6 except that a matched state between the tunnel barrier layer and the second ferromagnetic metal layer was set to a mixture of ConC and R45. A film was formed by setting the temperature of the substrate during film formation to 280 degrees, and thereby the matched state between the tunnel barrier layer and the second ferromagnetic metal layer was set to the mixture of ConC and R45.

In Examples 1 to 8, Comparative Examples 1 and 2, and Reference Example 1, it was checked by electron beam diffraction measurement whether the matched state between the tunnel barrier layer and the second ferromagnetic metal layer corresponded to any of R45, ConC, or a mixture thereof.

The matched state can also be checked by X-ray diffraction measurement rather than the electron beam diffraction measurement. In the case of the electron beam diffraction measurement, diffraction patterns of the whole film thicknesses are simultaneously observed, and thus the matched state can be easily checked by comparing R45, ConC, or the mixture thereof with a simulation result of the diffraction pattern. The case of the X-ray diffraction measurement is also similar, but much measurement time is required to make a comparison based on the simulation result. In the case where measurement is performed in the laminating direction, a layer close to a surface has strong strength, and a layer distant from the surface has weak strength. Thus, there is a possibility of the evaluation being made erroneously. However, the case of the X-ray diffraction measurement has an advantage that a change in lattice constant due to lattice strain can also be detected.

The resistance area product value (RA) and an MR ratio of the obtained magnetoresistance effect element are measured according to the aforementioned evaluating method. The MR ratio is an MR ratio when a bias voltage of 1 V is applied. A relation between the measured MR ratio and the degree of lattice matching is represented in Table 2.

The RA divides a resistance value, which is obtained by dividing the applied bias voltage by an electric current supplied in the laminating direction of the magnetoresistance effect element, by an area of the surface to which each layer is joined, and is standardized with the resistance value in a unit area, and a unit thereof is $\Omega \cdot \mu m^2$. The applied bias voltage and a value of the electric current supplied in the laminating direction of the magnetoresistance effect element can be measured and obtained by a voltmeter and an ammeter.

TABLE 2

| | Tunnel barrier layer | Ferromagnetic layer | Joined state | Degree of lattice matching | RA | MR ratio | Thickness of tunnel barrier layer |
|---|---|---|---|---|---|---|---|
| Example 1 | MgO | Fe$_2$CoSi | R45 | 5.7 | 0.62 | 26.4 | 8.5 |
| Comparative Example 1 | | Fe$_2$CoSi | ConC | 49.4 | 0.72 | 14.3 | 8.5 |
| Referrence Example 1 | | Fe | R45 | 3.9 | 0.59 | 27.1 | 8.5 |
| Example 2 | MgAl$_2$O$_4$ | Fe$_2$CoSi | R45 | 2.7 | 0.8 | 98.2 | 7.5 |
| Comparative Example 2 | | Fe$_2$CoSi | ConC | 13.3 | 1.05 | 10.4 | 7.5 |
| Example 3 | ZnGa$_2$O$_4$ | Fe$_2$CoSi | R45 | 9.0 | 0.72 | 23.4 | 9 |
| Example 4 | | Fe$_2$CoSi | ConC | 4.4 | 0.65 | 41.8 | 9 |
| Example 5 | | Fe$_2$CoSi | R45 + ConC | — | 0.62 | 53.2 | 9 |
| Example 6 | Mg$_{0.5}$Zn$_{0.5}$Ga$_2$O$_4$ | Fe$_2$CoSi | R45 | 5.0 | 0.6 | 57.4 | 8.5 |
| Example 7 | | Fe$_2$CoSi | ConC | 5.3 | 0.6 | 54.4 | 8.5 |
| Example 8 | | Fe$_2$CoSi | R45 + ConC | — | 0.6 | 68.3 | 8.5 |

When Example 1 is compared with Comparative Example 1, in the case where the tunnel barrier layer is MgO, MgO is matched with Fe$_2$CoSi by R45. The degree of lattice matching is reduced (that is, the lattice matching characteristic is enhanced), and the MR ratio is increased. The MR ratio is equivalent to that when Fe is used in the ferromagnetic layer (Reference Example 1). As represented in Example 2 and Comparative Example 2, in the case where the tunnel barrier layer is MgAl$_2$O$_4$, the same tendency was confirmed.

Meanwhile, in the case where the tunnel barrier layer is ZnGa$_2$O$_4$, the degree of lattice matching is 10% or less in any of R45 (Example 3), ConC (Example 4), and the mixture thereof (Example 5), and a high MR ratio can be realized. In the case where the tunnel barrier layer is a mixed crystal, the same result is confirmed.

That is, it is understood that a high MR ratio can be realized if the degree of lattice matching is 10% or less in Table 1, and an extremely high MR ratio can be realized if the degree of lattice matching is 5% or less.

INDUSTRIAL APPLICABILITY

Since the magnetoresistance effect element of the present invention has a high MR ratio, it is suitable for a magnetic sensor, a high frequency component, a magnetic head, and a magnetic random access memory.

REFERENCE SIGNS LIST

1 First ferromagnetic metal layer
2 Second ferromagnetic metal layer
2A Crystal surface
3 Tunnel barrier layer
3A Crystal surface
4 Underlayer
5 Cap layer
10 Magnetoresistance effect element
11 Substrate
12 Electrode layer
13 Power supply
14 Voltmeter
15 Contact electrode
20 Magnetoresistance effect device
U$_2$, U$_3$ Unit lattice

What is claimed is:

1. A magnetoresistance effect element comprising: a first ferromagnetic metal layer; a second ferromagnetic metal layer; and a tunnel barrier layer provided between the first ferromagnetic metal layer and the second ferromagnetic metal layer,
    wherein the tunnel barrier layer has a cubic crystal structure,
    the first ferromagnetic metal layer or the second ferromagnetic metal layer is formed of a material having a cubic crystal structure represented by Fe$_2$CoSi,
    a crystal surface for crystals constituting the tunnel barrier layer and a crystal surface for crystals constituting the first ferromagnetic metal layer or the second ferromagnetic metal layer are matched to be inclined at 0° or 45° in at least a part of a crystal interface between the tunnel barrier layer and the first ferromagnetic metal layer or the second ferromagnetic metal layer.

2. The magnetoresistance effect element according to claim 1, wherein:
    the tunnel barrier layer is formed of any one of the group consisting of MgO, MgAl$_2$O$_4$, γ-Al$_2$O$_3$, and ZnAl$_2$O$_4$, and a mixed crystal material thereof, and
    the crystal surface for the crystals constituting the tunnel barrier layer and the crystal surface for the crystals constituting the first ferromagnetic metal layer or the second ferromagnetic metal layer are matched to be inclined at 45° in the crystal interface.

3. The magnetoresistance effect element according to claim 2, wherein the tunnel barrier layer is formed of MgO.

4. The magnetoresistance effect element according to claim 2, wherein the tunnel barrier layer is formed of MgAl$_2$O$_4$.

5. The magnetoresistance effect element according to claim 2, wherein the tunnel barrier layer is formed of γ-Al$_2$O$_3$.

6. The magnetoresistance effect element according to claim 2, wherein the tunnel barrier layer is formed of ZnAl$_2$O$_4$.

7. The magnetoresistance effect element according to claim 1, wherein the tunnel barrier layer is formed of any one of the group consisting of MgGa$_2$O$_4$, ZnGa$_2$O$_4$, CdAl$_2$O$_4$, and a mixed crystal material thereof.

8. The magnetoresistance effect element according to claim 7, wherein:
    the tunnel barrier layer is formed of MgGa$_2$O$_4$; and
    the crystal surface for the crystals constituting the tunnel barrier layer and the crystal surface for the crystals constituting the first ferromagnetic metal layer or the second ferromagnetic metal layer are matched to be inclined at 45° in the crystal interface.

9. The magnetoresistance effect element according to claim 7, wherein:
the tunnel barrier layer is formed of $MgGa_2O_4$; and
the crystal surface for the crystals constituting the tunnel barrier layer and the crystal surface for the crystals constituting the first ferromagnetic metal layer or the second ferromagnetic metal layer are matched to be inclined at 0° in the crystal interface.

10. The magnetoresistance effect element according to claim 7, wherein:
the tunnel barrier layer is formed of $MgGa_2O_4$; and
portions where the crystal surface for the crystals constituting the tunnel barrier layer and the crystal surface for the crystals constituting the first ferromagnetic metal layer or the second ferromagnetic metal layer are matched to be inclined at 0° and 45° in the crystal interface are mixed.

11. The magnetoresistance effect element according to claim 7, wherein:
the tunnel barrier layer is formed of $ZnGa_2O_4$; and
the crystal surface for the crystals constituting the tunnel barrier layer and the crystal surface for the crystals constituting the first ferromagnetic metal layer or the second ferromagnetic metal layer are matched to be inclined at 45° in the crystal interface.

12. The magnetoresistance effect element according to claim 7, wherein:
the tunnel barrier layer is formed of $ZnGa_2O_4$; and
the crystal surface for the crystals constituting the tunnel barrier layer and the crystal surface for the crystals constituting the first ferromagnetic metal layer or the second ferromagnetic metal layer are matched to be inclined at 0° in the crystal interface.

13. The magnetoresistance effect element according to claim 7, wherein:
the tunnel barrier layer is formed of $ZnGa_2O_4$; and
portions where the crystal surface for the crystals constituting the tunnel barrier layer and the crystal surface for the crystals constituting the first ferromagnetic metal layer or the second ferromagnetic metal layer are matched to be inclined at 0° and 45° in the crystal interface are mixed.

14. The magnetoresistance effect element according to claim 7, wherein:
the tunnel barrier layer is formed of $CdAl_2O_4$; and
the crystal surface for the crystals constituting the tunnel barrier layer and the crystal surface for the crystals constituting the first ferromagnetic metal layer or the second ferromagnetic metal layer are matched to be inclined at 45° in the crystal interface.

15. The magnetoresistance effect element according to claim 7, wherein:
the tunnel barrier layer is formed of $CdAl_2O_4$; and
the crystal surface for the crystals constituting the tunnel barrier layer and the crystal surface for the crystals constituting the first ferromagnetic metal layer or the second ferromagnetic metal layer are matched to be inclined at 0° in the crystal interface.

16. The magnetoresistance effect element according to claim 7, wherein:
the tunnel barrier layer is formed of $CdAl_2O_4$; and
portions where the crystal surface for the crystals constituting the tunnel barrier layer and the crystal surface for the crystals constituting the first ferromagnetic metal layer or the second ferromagnetic metal layer are matched to be inclined at 0° and 45° in the crystal interface are mixed.

17. The magnetoresistance effect element according to claim 1, wherein:
the tunnel barrier layer is formed of $CdGa_2O_4$; and
the crystal surface for the crystals constituting the tunnel barrier layer and the crystal surface for the crystals constituting the first ferromagnetic metal layer or the second ferromagnetic metal layer are matched to be inclined at 0° in the crystal interface.

18. The magnetoresistance effect element according to claim 1, wherein at least one of the first ferromagnetic metal layer and the second ferromagnetic metal layer has magnetic anisotropy perpendicular to the crystal interface.

19. A magnetic sensor using the magnetoresistance effect element according to claim 1.

20. A magnetic memory using the magnetoresistance effect element according to claim 1.

* * * * *